United States Patent [19]

Wada

[11] Patent Number: 5,194,395

[45] Date of Patent: Mar. 16, 1993

[54] METHOD OF PRODUCING A SUBSTRATE HAVING SEMICONDUCTOR-ON-INSULATOR STRUCTURE WITH GETTERING SITES

[75] Inventor: Kunihiko Wada, Kawasaki, Japan

[73] Assignee: Fujitsu Limited, Kanagawa, Japan

[21] Appl. No.: 739,540

[22] Filed: Aug. 2, 1991

Related U.S. Application Data

[62] Division of Ser. No. 382,937, Jul. 21, 1989, Pat. No. 5,063,113.

[30] Foreign Application Priority Data

Jul. 28, 1988 [JP] Japan ................................ 63-186872

[51] Int. Cl.$^5$ .......................................... H01L 21/306
[52] U.S. Cl. ...................................... 437/10; 437/11; 437/12; 437/62; 148/DIG. 60
[58] Field of Search ..................... 437/10, 11, 12, 62; 448/DIG. 60, DIG. 61

[56] References Cited

U.S. PATENT DOCUMENTS

| | | | |
|---|---|---|---|
| 4,226,914 | 10/1980 | Terner et al. | 428/446 |
| 4,288,495 | 9/1981 | Terner et al. | 428/428 |
| 4,371,403 | 2/1983 | Ikubo et al. | 437/24 |
| 4,499,147 | 2/1985 | Enomoto et al. | 428/446 |
| 4,608,095 | 8/1986 | Hill | 437/12 |
| 4,608,096 | 8/1986 | Hill | 437/12 |
| 4,666,532 | 5/1987 | Korb et al. | 437/13 |
| 4,781,766 | 11/1988 | Barnett et al. | 437/4 |
| 4,789,421 | 12/1988 | Umeno et al. | 428/446 |
| 4,962,051 | 10/1990 | Liaw | 437/62 |

FOREIGN PATENT DOCUMENTS

| | | |
|---|---|---|
| 133954 | 3/1984 | European Pat. Off. |
| 196122 | 10/1986 | European Pat. Off. |
| 63-29937 | 1/1988 | Japan |

OTHER PUBLICATIONS

"Gettering Technique Resulting in Defect-Free Devices", M. R. Poponiak and T. H. Yeh, IBM Technical Disclosure Bulletin, vol. 16, No. 4, Sep. 1973, p. 1023.

*Primary Examiner*—Brian E. Hearn
*Assistant Examiner*—Trung Dang
*Attorney, Agent, or Firm*—Nikaido, Marmelstein, Murray & Oram

[57] ABSTRACT

A substrate has a semiconductor-on-insulator structure. The substrate has a base substrate, an insulator layer provided on the base substrate, an active substrate provided on the insulator layer and having gettering sites, and an active layer provided on the active substrate and made of a semiconductor. The gettering sites under the active layer eliminate crystal defects and impurities generated in the active layer during the semiconductor device production in which elements are formed in the active layer.

12 Claims, 9 Drawing Sheets

METHOD OF PRODUCING A SUBSTRATE HAVING SEMICONDUCTOR-ON-INSULATOR STRUCTURE WITH GETTERING SITES

This is a divisional of application Ser. No. 382,937 filed Jul. 21, 1989, now U.S. Pat. No. 5,063,113.

BACKGROUND OF THE INVENTION

The present invention generally relates to substrates having semiconductor-on-insulator structures and production methods thereof, and more particularly to a substrate having a semiconductor-on-insulator structure with gettering sites and a production method thereof.

A substrate having a silicon-on-insulator (SOI) structure (hereinafter simply referred to as an SOI substrate) is effectively used as a semiconductor crystalline substrate for realizing a high-speed operation of a semiconductor device.

Generally, when producing a semiconductor device having a semiconductor crystalline substrate, it is necessary to carry out a gettering to eliminate crystal defects and impurities which are generated during a production process of the semiconductor device from an active layer in which semiconductor elements are formed. However, in the case of a semiconductor device having the SOI substrate, it is difficult to realize the gettering function due to its structure. This difficulty in realizing the gettering function in the SOI substrate is an obstacle to obtaining a high performance in the semiconductor device having the SOI substrate.

Figure 1A:
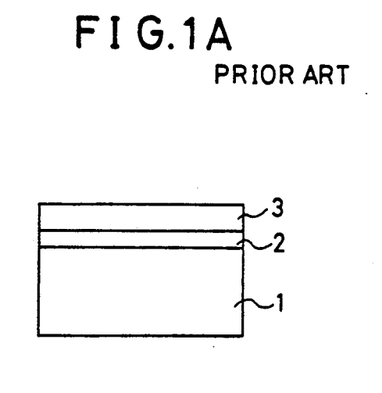
FIGS. 1A and 1B and FIGS. 2A and 2B respectively are cross sectional views for explaining problems of forming gettering sites in an SOI substrate.
Figure 1B:
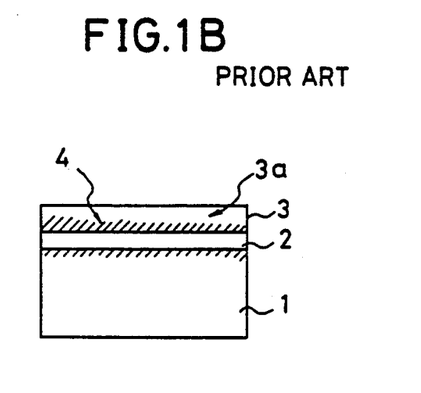

As methods of forming the SOI substrate, there basically are two methods. According to a first method, an SOI substrate is first formed, and a gettering site is formed thereafter. In FIG. 1A, the SOI substrate comprises a substrate 1, a silicon dioxide (SiO$_2$) layer 2 which is formed on the substrate 1, and a silicon (Si) layer which is formed on the SiO$_2$ layer 2. This SOI substrate is subjected to a thermal process so as to form a gettering site 4 in the Si layer 3 as shown in FIG. 1B. However, the coefficients of thermal expansion of SiO$_2$ and Si are different, and it is undesirable to subject the SOI substrate to the thermal process which is carried out at a relatively high temperature in the order of 1400° C. for a relatively long time. In addition, because the thickness of the Si layer 3 is in the order of 5 microns and small, the gettering site 4 is small and unsatisfactory for carrying out the intended elimination of the crystal defects and impurities from a denuded zone 3a of the layer 3.

According to a second method, two stacked structures respectively made up of a single crystal Si substrate and an SiO$_2$ layer are prepared and the SiO$_2$ layers of the two stacked structures are bonded to form a so-called bonded substrate. This method is a more promising method than the first method due to recent improvements in bonding techniques. But it is impossible to realize the gettering function in the SOI substrate which is produced by this second method.

As methods of forming gettering sites in the substrate, there are the extrinsic gettering and the intrinsic gettering. The extrinsic gettering forms the gettering sites by applying an external distortion to a back surface of the Si semiconductor substrate. On the other hand, the intrinsic gettering uses the Si semiconductor substrate which is formed by the Czochralski method, for example. Normally, the Si semiconductor substrate formed by the Czochralski method includes oxygen (O$_2$) in the order of $1 \times 10^{18}$ cm$^{-3}$, and thus, the extrinsic gettering forms the gettering sites by subjecting the Si semiconductor substrate to a thermal process to precipitate SiO$_2$.

In the case of the SOI substrate formed by the second method, the SiO$_2$ layer exists at the central portion and it is impossible to employ the extrinsic gettering to form the gettering sites.

In addition, it is also impossible to employ the intrinsic gettering to form the gettering site in the SOI substrate which is formed by the second method for the following reasons. That is, in the SOI substrate, the thickness of a single crystal semiconductor layer in which semiconductor elements are formed needs to be in the order of 5 microns, and it is virtually impossible to form both an active layer for forming the semiconductor elements and the gettering sites in this extremely thin single crystal semiconductor layer.

Normally, when realizing the gettering function in the Si semiconductor substrate which is formed by the Czochralski method, the Si semiconductor substrate is subjected to a thermal process at a temperature of over 1000° C. so as to diffuse the O$_2$ in vicinities of the front and back surfaces of the Si semiconductor substrate and form a denuded zone. Then, a thermal process is carried out at a temperature in a range of 400° C. to 600° C. to form gettering sites. Next, a thermal process is carried out at a temperature of over 1000° C. to grow the gettering sites.

Figure 2A:
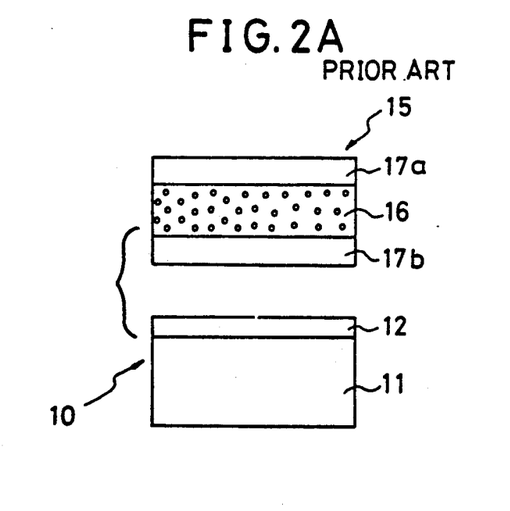
Figure 2B:
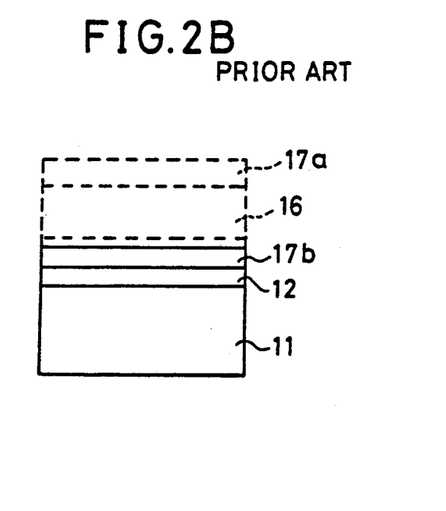

The semiconductor elements are formed in the denuded zone, but the thickness of the denuded zone is in the order of 20 microns. Hence, even when a stacked structure 10 made up of a base substrate 11 and a SiO$_2$ layer 12 is bonded to another stacked structure 15 made up of a Si active substrate 16 and SiO$_2$ layers 17a and 17b and having gettering sites 18 formed by the intrinsic gettering as shown in FIG. 2A, the SiO$_2$ layer 17a and the Si substrate 16 must be polished so as to leave an active layer which has a thickness in the order of 5 microns. As shown in FIG. 2B, the gettering site 18 will be removed by the polishing as indicated by a phantom line and only the active layer remains according to this method. Therefore, in the case of the SOI substrate formed by the second method, it is also impossible to employ the intrinsic gettering to form the gettering site.

Therefore, in the case of the SOI substrate formed by the second method, it is impossible to form a gettering site.

Because it is conventionally impossible to realize the gettering function in the SOI substrate, there are problem in that it is impossible to eliminate by the gettering the crystal defects and impurities generated during the production process of the semiconductor device which has the SOI substrate, and there is no means to prevent deterioration in the characteristics of the semiconductor elements which are formed in the active layer.

SUMMARY OF THE INVENTION

Accordingly, it is a general object of the present invention to provide a novel and useful substrate having a semiconductor-on-insulator structure and a production method thereof in which the problems described above are eliminated.

Another and more specific object of the present invention is to provide a substrate having a semiconductor-on-insulator structure comprising a base substrate, an insulator layer provided on the base substrate, an active substrate provided on the insulator layer and having gettering sites, and an active layer provided on the active substrate and made of a semiconductor. According to the substrate of the present invention, it is possible to satisfactorily eliminate crystal defects and impurities which are generated in the active layer during the production process of a semiconductor device by the provision of the gettering sites under the active layer. Hence, it is possible to realize in the active layer a semiconductor element which has a satisfactory characteristic and is free of defects.

Still another object of the present invention is to provide a method of producing a substrate having a semiconductor-on-insulator structure comprising the steps of preparing a stacked structure having a base substrate and an insulator layer formed thereon, forming an active substrate on the insulator layer of the stacked structure which active substrate has gettering sites, and forming an active layer made of a semiconductor on the active substrate. According to the method of the present invention, it is possible to easily form the gettering sites in the substrate which has the semiconductor-on-insulator structure which includes the SOI structure. Hence, it is possible to improve the characteristics of semiconductor elements which are formed in the active layer.

Other objects and further features of the present invention will be apparent from the following detailed description when read in conjunction with the accompanying drawings.

DESCRIPTION OF THE PREFERRED EMBODIMENTS

A description will be given of a first embodiment of a production method according to the present invention for producing a first embodiment of a substrate having a semiconductor-on-insulator structure according to the present invention, by referring to FIGS. 3A through 3E.

Figure 3A:
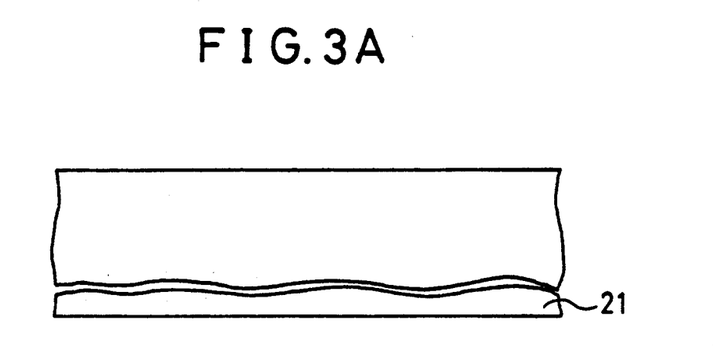
FIGS. 3A through 3E respectively are cross sectional views for explaining a first embodiment of a production method according to the present invention for producing a first embodiment of a substrate having a semiconductor-on-insulator structure according to the present invention.

A Si semiconductor active substrate 21 shown in FIG. 3A is prepared by the Czochralski method, for example. Of course, this active substrate 21 includes $O_2$.

Figure 3B:
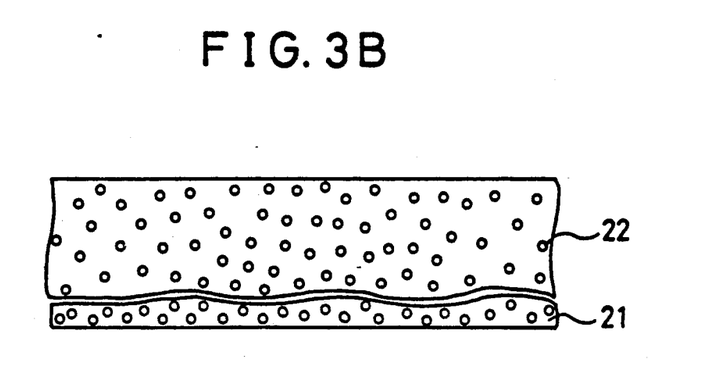

The active substrate 21 is subjected to a thermal process to form gettering sites 22 which are made of $SiO_2$ as shown in the FIG. 3B. No denuded zone is formed by this thermal process.

Figure 3C:
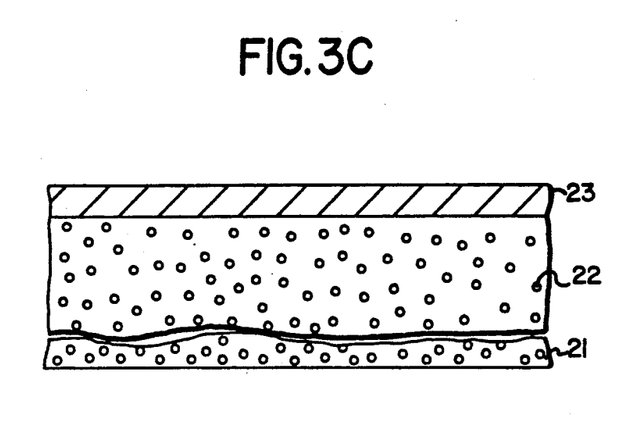

The active substrate 21 having the gettering sites 22 is subjected to a thermal process in an oxidizing atmosphere to form a $SiO_2$ layer 23 on a surface of the active substrate 21 as shown in FIG. 3C.

Figure 3D:
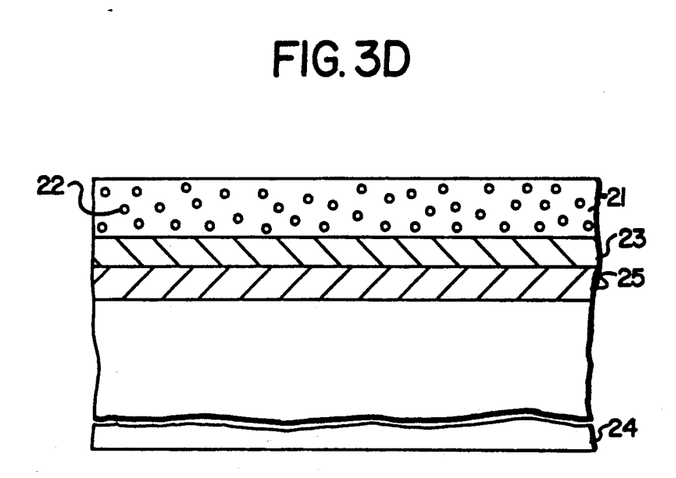

A Si semiconductor base substrate 24 is subjected to a thermal process in an oxidizing atmosphere to form a $SiO_2$ layer 25 on a surface of the base substrate 24, and the $SiO_2$ layer 25 is bonded to the $SiO_2$ layer 23 as shown in FIG. 3D. The active substrate 21 is polished to a predetermined thickness. As a result, a layer of the gettering sites 22 is formed in the active substrate 21 on top of the $SiO_2$ layer 23.

Figure 3E:
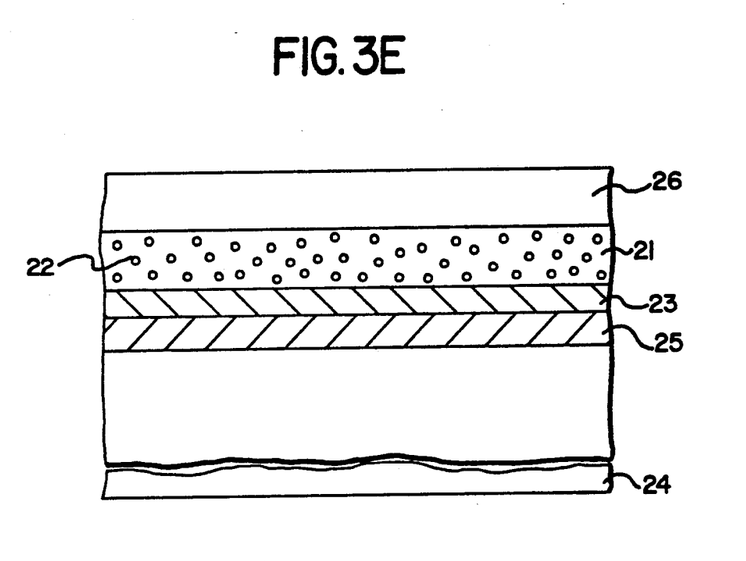

Finally, a Si semiconductor active layer 26 is formed on the active substrate 21 having the layer of the gettering sites 22 as shown in FIG. 3E. For example, the active layer 26 is formed by an epitaxial growth process.

Accordingly, this embodiment of the substrate having a semiconductor-on-insulator structure according to the present invention comprises a base stacked structure which is made up of the base substrate 24 and the $SiO_2$ layer 25, and an active stacked structure which is made up of the active substrate 21 and the $SiO_2$ layer 23. The base stacked structure and the active stacked structure are bonded by bonding the $SiO_2$ layers 25 and 23, and the active layer 26 is formed on the active substrate 21 which has the layer of the gettering sites 22.

Because the layer of the gettering sites 22 is provided under the active layer 26, the crystal defects and impurities generated within the active layer 26 during the production process of the semiconductor device can be eliminated by the gettering function of the layer of the gettering sites 22. For this reason, it is possible to form semiconductor elements having satisfactory characteristics in the active layer 26.

Next, a description will be given of a second embodiment of the production method according to the present invention for producing a second embodiment of the substrate having a semiconductor-on-insulator structure according to the present invention, by referring to FIGS. 4A through 4G.

Figure 4A:
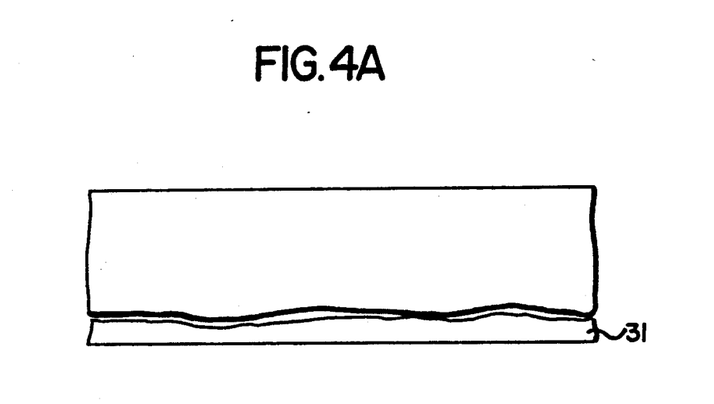
FIGS. 4A through 4G respectively are cross sectional views for explaining a second embodiment of the production method according to the present invention for producing a second embodiment of the substrate having the semiconductor-on-insulator structure according to the present invention.

A base substrate 31 shown in FIG. 4A is prepared. In this embodiment, the substrate 31 is made of a single crystal Si semiconductor. However, the base substrate 31 may be made of other materials such as polysilicon, compound semiconductor, ceramic, refractory metal, and quartz.

Figure 4B:
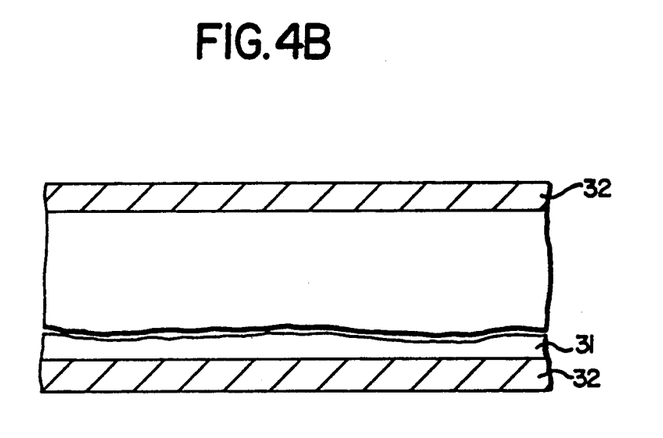

The base substrate 31 is subjected to a thermal process in an oxidizing atmosphere to form a $SiO_2$ layer 32 as shown in FIG. 4B. The $SiO_2$ layer 32 is formed to a thickness in a range of 1000 Å to 1 micron. When the base substrate 31 is made of a material other than the single crystal Si semiconductor, a $SiO_2$ layer can be formed directly on the base substrate by an oxidation process carried out after growing a polysilicon layer, a chemical vapor deposition or the like.

Figure 4C:
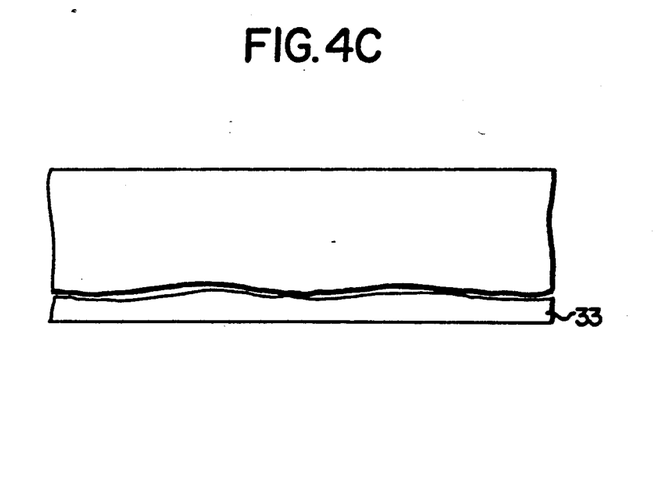

An active substrate 33 shown in FIG. 4C is prepared by the Czochralski method. The active substrate 33 includes $1 \times 10^{17}$ or more of $O_2$.

Figure 4D:
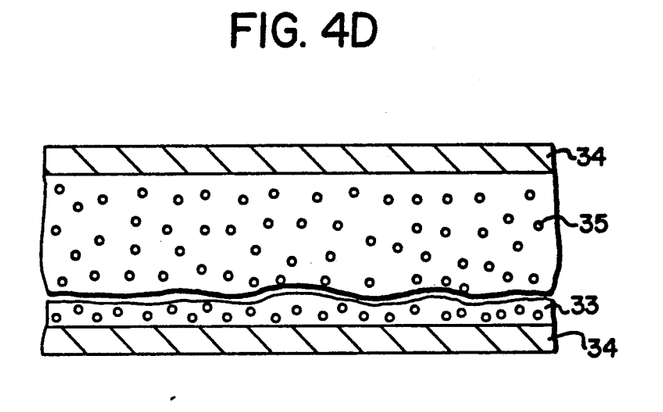

For example, the active substrate 33 is subjected to a thermal process at 450° C. for 5 hours and then to a thermal process at 1100° C. for 1 hour to precipitate and grow gettering sites 35 made of $SiO_2$ as shown in FIG. 4D. Then, a thermal process is carried out in an oxidizing atmosphere to form a SiO$_2$ layer 34 on both sides of the substrate 33 to a thickness in the order of 2000 Å.

Figure 4E:
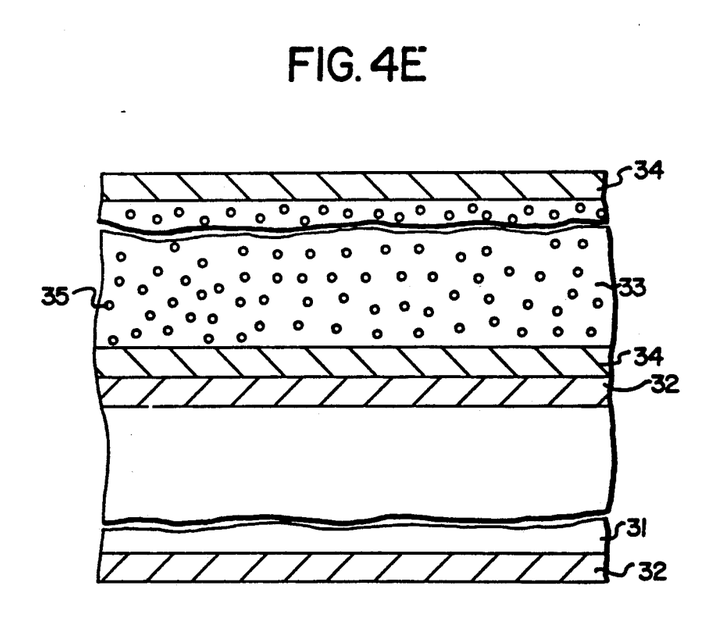
Figure 4F:
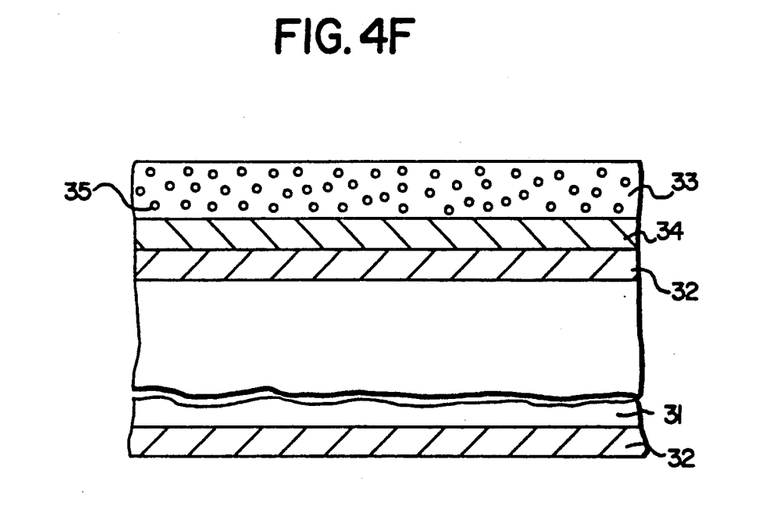

The substrates 31 and 33 are bonded by bonding SiO$_2$ layers 32 and 34 as shown in FIG. 4E. For example, this bonding is achieved under the following bonding conditions.
Temperature: 1000° C.
Pulse voltage: ±300 V
Time: 5 minutes The active stacked structure made up of the SiO$_2$ layer 34 and the active substrate 33 are polished to a thickness of 3 microns, for example. As a result, only the layer of the gettering sites 35 of the active substrate 33 remains on the SiO$_2$ layer 34 which is bonded to the SiO$_2$ layer 32 as shown in FIG. 4F. For example, a polishing agent comprising Al$_2$O$_3$, a chemical etchant or the like may be used for the polishing process.

Figure 4G:
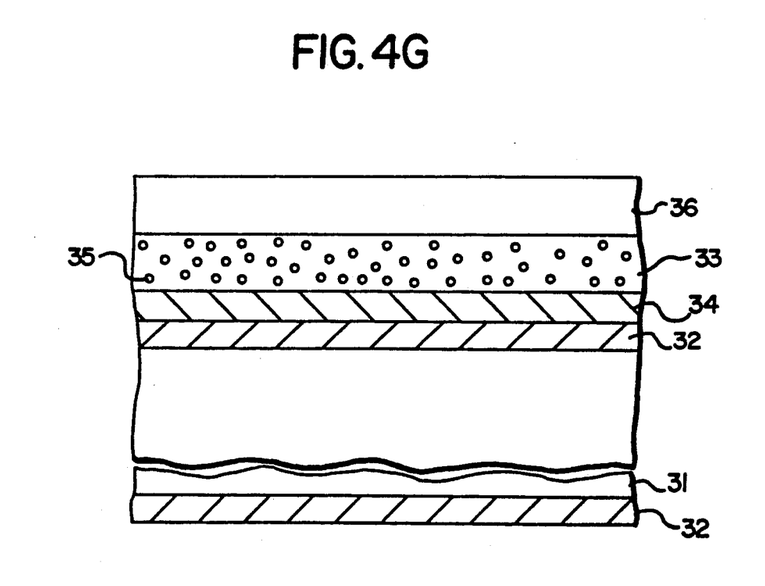

A Si semiconductor active layer 36 is formed on the active substrate 33 which is constituted by the layer of the gettering sites 35 as shown in FIG. 4G. For example, the active layer 36 is formed by an epitaxial growth process to a thickness of 1 micron. As described before, the crystal defects and impurities generated in the active layer 36 during the production process of the semiconductor device are effectively eliminated by the provision of the layer of the gettering sites 35 under the active layer 36.

The effects of the present invention were confirmed by forming a metal oxide semiconductor (MOS) diode in the substrate of the present invention and comparing characteristics thereof with a MOS diode formed in the conventional SOI substrate. An SOI substrate having a layer of gettering sites with a thickness of 1 micron and an active layer with a thickness of 2 microns was used as the substrate of the present invention, while an SOI substrate having no layer of gettering sites and an active layer with a thickness of 3 microns was used as the conventional SOI substrate. Identical MOS diodes were formed in the respective active layers of the two SOI substrates, and life times of minority carriers were measured. The life time of minority carriers in the substrate of the present invention was 800±100 microseconds, while the life time of minority carriers in the conventional SOI substrate was 500±200 microseconds. It was thus confirmed that the absolute value of the life time of minority carriers in the present invention is considerably longer compared to that obtained in the conventional SOI substrate, and the deviation in the life time of minority carriers in the present invention is small compared to that of the conventional SOI substrate.

Accordingly, it is clear from the above measurements that a junction leak current can be suppressed to an extremely small value by use of the SOI substrate of the present invention. In addition, in the case of a dynamic random access memory (DRAM) employing the substrate of the present invention, it is evident that the information storage characteristic can be improved. In other words, the characteristic of the elements formed in the SOI substrate and the production yield can both be improved.

In the embodiment described heretofore, the substrate has the SOI structure. However, the present invention is of course applicable to any substrate having the semiconductor-on-insulator structure. For example, it is possible to use gallium arsenide (GaAs) for the active substrate in place of Si and form a layer of gettering sites in the GaAs active substrate. In this case, the gettering sites may be formed in the GaAs active substrate by an ion implantation process or the like after the GaAs active substrate is formed on the insulator layer. Furthermore, the base substrate may be made of a material other than Si such as polysilicon, silicon carbide, metal, and insulator. The insulator layer is also not limited to the SiO$_2$ layer, and the insulator layer may be made of any insulator such as glass and phosphosilicate glass (PSG).

Figure 5A:
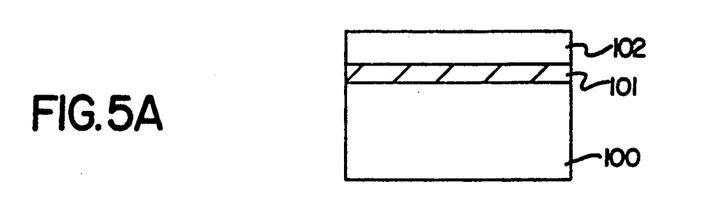
FIGS. 5A through 5D respectively are cross sectional views for explaining a third embodiment of the production method according to the present invention for producing a third embodiment of the substrate having the semiconductor-on-insulator structure according to the present invention.
Figure 5B:
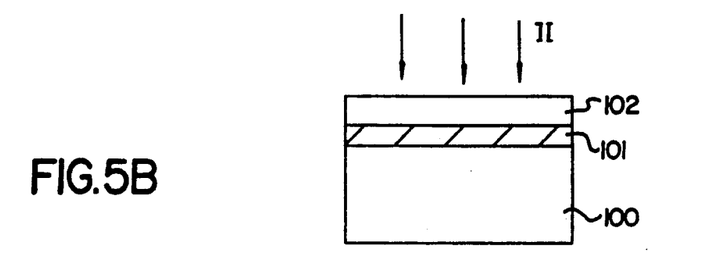
Figure 5C:
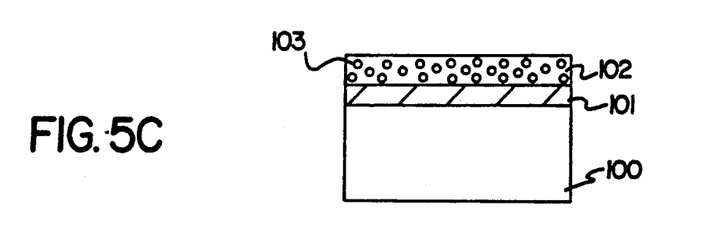
Figure 5D:
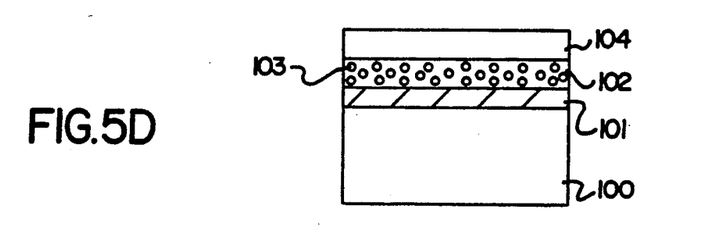

FIGS. 5A through 5C show production steps of a third embodiment of the production method according to the present invention for producing a third embodiment of the substrate having the semiconductor-on-insulator structure according to the present invention. First, a GaAs active substrate (layer) 102 is formed on an insulator layer 101 which is provided on top of a base substrate 100 as shown in FIG. 5A. The stacked structure shown in FIG. 5A is subjected to an ion implantation as shown in FIG. 5B to form gettering sites 103 in the GaAs active substrate 102 as shown in FIG. 5C. A GaAs active layer 104 is formed on the GaAs active substrate 102 which has the gettering sites 103, as shown in FIG. 5D.

As a modification of this embodiment, it is possible to prepare a GaAs active substrate 102 which already has the gettering sites 103 formed therein and bond this GaAs active substrate on the insulator layer 101.

Figure 6:
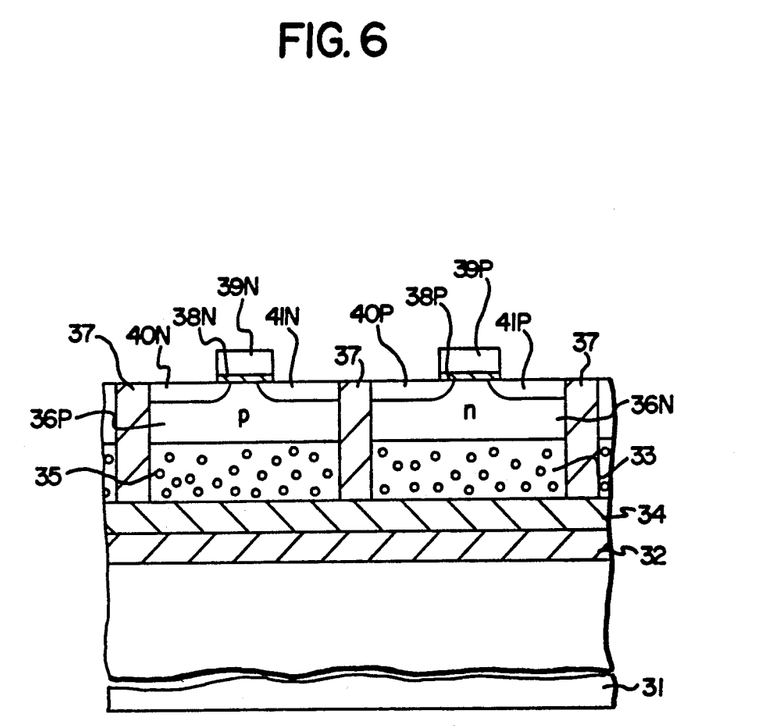
FIG. 6 is a cross sectional view showing a CMOS field effect semiconductor device which is applied with the present invention.

Next, a description will be given of a complementary metal oxide semiconductor (CMOS) field effect semiconductor device which is applied with the present invention, by referring to FIG. 6. In FIG. 6, the substrate employs the SOI structure as the semiconductor-on-insulator structure. In FIG. 6, those parts which are substantially the same as those corresponding parts in FIGS. 4A through 4G are designated by the same reference numerals, and a description thereof will be omitted.

In FIG. 6, a p-type well 36P and an n-type well 36N are formed in the active layer 36. A SiO$_2$ element isolation layer 37 is formed to the SiO$_2$ layer 34 to isolate elements formed in the active layer 36. An n-channel transistor formed in the active layer 36 comprises a SiO$_2$ gate insulator layer 38N, a polysilicon gate electrode 39N, an n$^+$-type source region 40N, and an n$^+$-type drain region 41N. A p-channel transistor formed in the active layer 36 comprises a SiO$_2$ gate insulator layer 38P, a polysilicon gate electrode 39P, a p$^+$-type source region 40P, and a p$^+$-type drain region 41P.

As may be seen from FIG. 6, this CMOS field effect semiconductor device has the layer of the gettering sites 35 under the p-type well 36P and the n-type well 36N. Hence, it is possible to eliminate the crystal defects and impurities generated during the production process. For example, it is thus possible to prevent a junction leak and a deterioration of the withstand voltage of the gate insulator layers 38N and 38P. Of course, the n-channel transistor and the p-channel transistor are completely isolated by the SiO$_2$ as in the case of the conventional SOI structure. Therefore, it is possible to easily realize a latch up free device. In addition, since the source regions 40N and 40P and the drain regions 41N and 41P are in contact with the element isolation layer 37 which is made of SiO$_2$, it is possible to suppress the spreading of the depletion layer, make the stray capacitance small and thus realize a high switching speed.

In the described embodiments, the bonded substrate is used as the substrate having the semiconductor-on-insulator structure. However, it is not essential that the layer of gettering sites is bonded on the insulator layer of the substrate. It is possible to form the gettering sites in a layer after the layer is formed or bonded on the insulator layer.

Further, the present invention is not limited to these embodiments, but various variations and modifications may be made without departing from the scope of the present invention.

What is claimed is:

1. A method of producing a substrate having a semiconductor-on-insulator structure comprising the steps of:
   preparing a stacked structure having a base substrate and an insulator layer formed thereon;
   forming an active substrate on the insulator layer of said stacked structure, said active substrate having gettering sites; and
   forming an active layer on said active substrate, said active layer being made of a semiconductor.

2. The method as claimed in claim 1 wherein said base substrate is made of a material selected from a group including silicon, polysilicon, silicon carbide, metal, and insulator.

3. The method as claimed in claim 1 wherein said insulator layer is made of a material selected from a group including silicon dioxide, glass and phosphosilicate glass.

4. The method as claimed in claim 1 wherein said active substrate is made of a material selected from a group of semiconductors including silicon and gallium arsenide.

5. The method as claimed in claim 1 wherein said active layer is made of a material selected from a group including silicon and gallium arsenide.

6. The method as claimed in claim 1 wherein said insulator layer is made of silicon dioxide, said active substrate is made of silicon, and said active layer is made of silicon.

7. The method as claimed in claim 1 which further comprises the step of forming metal oxide semiconductor elements in said active layer.

8. The method as claimed in claim 1 wherein said step of forming said active substrate on said insulator layer includes a substep of forming an insulator layer on said active substrate and a substep of bonding the insulator layer of said active substrate on the insulator layer of said stacked structure.

9. The method as claimed in claim 1 wherein said step of forming said active substrate on said insulator layer includes a substep of preparing said active substrate by Czochralski method, a substep of forming the gettering sites in said active substrate by a thermal process, a substep of forming an insulator layer on said active substrate by a thermal process, and a substep of bonding the insulator layer of said active substrate on the insulator layer of said stacked structure.

10. The method as claimed in claim 1 wherein said step of forming said active layer grows said active layer by an epitaxial growth process.

11. The method as claimed in claim 1 wherein said step of forming said active substrate forms the gettering sites in said active substrate before forming said active substrate on said insulator layer.

12. The method as claimed in claim 1 wherein said step of forming said active substrate forms the gettering sites in said active substrate after forming said active substrate on said insulator layer.

* * * * *